July 6, 1965 H. T. GNUSE 3,193,805
BISTABLE CIRCUIT
Filed June 4, 1962
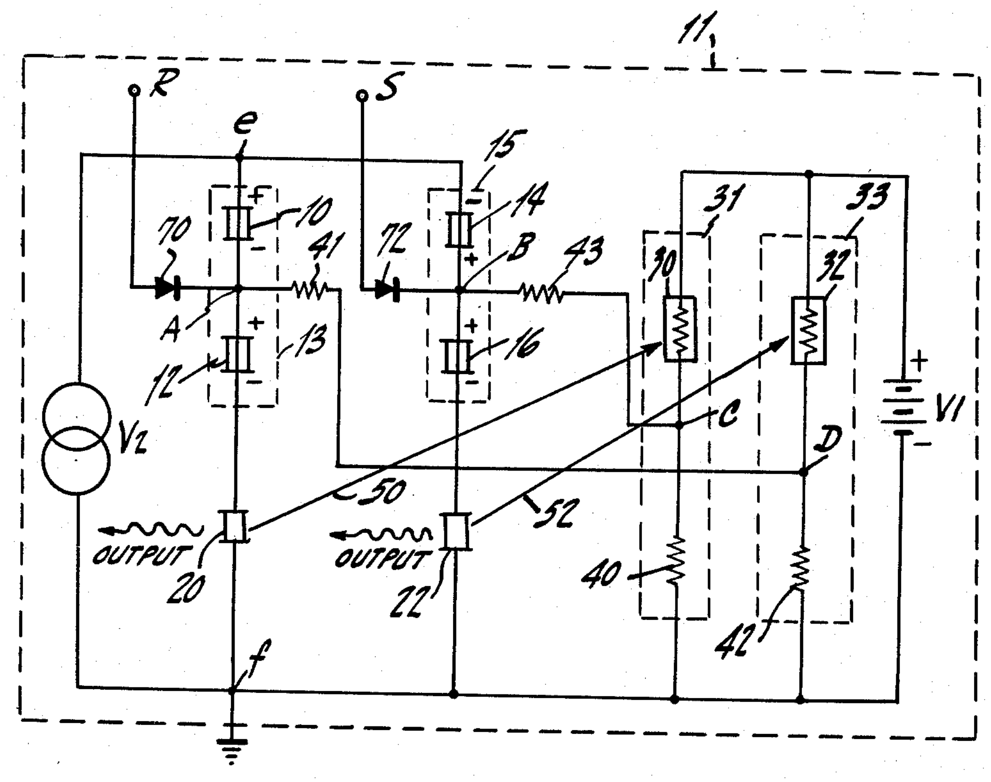
INVENTOR.
HARMON T. GNUSE
BY John V. Regan
Attorney

United States Patent Office 3,193,805
Patented July 6, 1965

3,193,805
BISTABLE CIRCUIT

Harmon T. Gnuse, Van Nuys, Calif., assignor to Radio Corporation of America, a corporation of Delaware Filed June 4, 1962, Ser. No. 199,912
5 Claims. (Cl. 340—173.2)

This invention relates, in general, to triggerable storage devices, and in particular to triggerable storage devices employing combinations of ferroelectric elements and radiation emitting devices.

Devices of this kind are useful, for example, in connection with alpha-numeric display panels, multi-element switches or gates to activate and de-activate the proper panels, counting circuits and other similar circuits required to be switched from one condition to another.

Radiation emitting devices, such as electroluminescent elements (EL), have many characteristics which make them highly desirable in many display applications. Their advantages are compact solid-state construction, low power requirements and consequent cool operation, use of inexpensive materials, and wide receiving angle for the displays. Bistable circuits employing electroluminescent elements require a relatively high alternating current voltage excitation for efficient useful application which in turn requires a relatively high direct-current voltage to set and reset the circuit.

The high-voltage, high impedance, and audio frequency requirements of EL elements makes difficult the conventional transistor circuitry. The large numbers of elemental display areas which need individual control in most of the possible display applications make it desirable that the individual control elements be very small and inexpensive. Photoconductor (PC) and ferroelectric (FE) devices are suitable for the control elements.

Accordingly, it is an object of the invention to provide an improved bistable storage circuit.

Another object of the invention is to provide an improved bistable circuit capable of delivering a relatively high voltage excitation to a radiation emitting element which may be set and reset by application of relatively low direct-current pulses.

According to the invention, a bistable circuit comprises two cross-coupled networks each comprising a voltage sensitive radiation emitting element and an electronic switch connected in a series circuit, and having a radiation responsive control element coupled to the electronic switch. An energizing voltage is applied across each of the networks to cause one or the other of the network elements to emit a radiation output. A bias voltage is coupled to the control element of each network to control the energization of its corresponding switch. The radiation emitting element of each network is cross-coupled to the radiation responsive element of the other network in a manner to provide regenerative feedback which in turn controls the radiation responsive element of the other network. Switching signals are selectively applied to the electronic switches to set and reset the bistable circuit.

The above and other objects and aspects of the invention will be apparent to those skilled in the art from the following detailed description taken in conjunction with the appended drawings, wherein:

The sole figure is a schematic diagram of a bistable circuit in accordance with the present invention.

Referring now to the drawing, there is shown a bistable circuit 11 comprising electroluminescent elements (EL) 20 and 22 which are the radiation emitting elements. The EL elements 20 and 22 may be a standard type which comprises a glass substrate on which a transparent conductive "tic" layer of tin is deposited, a layer of phosphor embedded in a dielectric which is deposited on the "tic", and a conductive opaque backing layer of aluminum. Other known types of voltage sensitive radiation emitting elements may be used for the EL elements 20 and 22. A first pair of ferroelectric elements (FE) 13 is connected in a series circuit with EL20, and a second pair of FE elements 15 is connected in a series circuit with EL element 22. A suitable ferro electric material may be crystals of triglycine sulfate or barium titanate. The FE pair 13 comprises FE element 10 and FE element 12 connected in series with each other at a midpoint A. The FE pair 15 comprises FE elements 14 and 16 connected in series with each other at a midpoint B. As described later, the two pairs of FE elements operate as two electronic switches for the EL elements. An energizing voltage source, having terminals *e* and *f*, is applied across each series circuit. Terminal *f* is connected to a point of reference potential, shown as ground, and it is a common point for both EL20 and EL22.

Voltage divider networks 31 and 33, connected in parallel to each other, constitute a control circuit for controlling the impedance presented by the FE pairs 13 and 15. The FE pairs 13 and 15 respectively present a large or a low impedance depending on the voltage applied to a midpoint between the ferroelectic elements that constitute each pair and function as voltage energizable electronic switches. A bias voltage source, shown as a battery $V_1$, is connected across the voltage divider networks 31 and 33. The voltage divider network 31 comprises a photoconductor element (PC) 30 and a resistor 40 connected in series with each other at a common point C. The voltage divider network 33 comprises a PC element 32 and a resistor 42 connected in series with each other at a common point D. Various known types of radiation responsive devices may be used for the PC elements 30 and 32, the type device selected depends on the type of radiation emitting elements employed. In the present example, photoconductive elements 30 and 32 are matched with the electroluminescent elements 20 and 22.

The divider common points C and D are coupled by isolation resistors 43 and 41 to the switch common points A and B, respectively. The resistors 40 and 42 and the negative side of the battery $V_1$ are connected to ground.

EL elements 20 and 22 are optically coupled to PC elements 30 and 32 respectively. The optical couplings between EL elements 20 and 22 and PC elements 30 and 32 are shown diagrammatically by arrows 50 and '52, respectively. The optical couplings 50 and 52 provide the light feedback which controls the resistance presented by the PC elements 30 and 32 respectively. The optical coupling may be through air with suitable shielding to prevent undesired couplings or by optical conducting elements such as fiber optics or rods. Also, the respective elements 20, 30 and 22, 32 may be placed in contact with each other.

The cathode electrode of isolation diodes 70 and 72 are connected to the switch common points A and B respectively. The anode electrodes of diodes 72 and 70 respectively constitute the set (S) and reset (R) terminals, of the bistable circuit 11, to which trigger pulses may be applied. Other triggering techniques for bistable circuit 11 are possible, including the application of light trigger pulses to the PC elements 30 and 32, or returning the divider common points C and D to set and reset circuits instead of respectively coupling them through resistors 40 and 42 to ground.

In operation, each of the EL elements 20 and 22 provides an appreciable light output when a certain value of energizing voltage is applied across it. An EL element is referred to as being on when the light output of that element has a brightness at or above a threshold value.

and off when the EL element has a light output which is below the threshold value. The bistable circuit 11 is described as being in its set state when EL element 20 is on and EL element 22 is off, and in its reset state when EL element 20 is off and EL element 22 is on.

Assuming that bistable circuit 11 is in its set state, the light output of EL20 is coupled through optical coupling 50 to PC30. The PC elements 30 and 32 present a resistance that varies inversely as a function of the received illumination. PC30 then presents a relatively low resistance, when EL20 is on, in comparison with the resistance of resistor 40 so that the voltage from battery $V_1$, applied across voltage divider network 31, appears almost entirely across resistor 40.

The voltage across resistor 40 is coupled to the common point B of the FE switch pair 15. FE elements 14 and 16 are then polarized in respectively different directions as indicated by the + and − signs and the switch 15 then presents a high impedance to the source of energizing voltage $V_2$. The impedance presented by EL22 to the energizing voltage source $V_2$ is relatively small compared to the impedance presented by the FE pair 15, so that only a small portion of the energizing voltage is applied across EL22. The voltage applied across EL22 is not enough to turn EL22 to its on state and hence EL22 does not provide an appreciable light output. PC32 presents a high resistance, relative to the resistance of resistor 42, and the divider common point D and hence the switch common point A are biased near ground potential.

The voltage coupled to the FE pair 13 polarizes FE10 and FE12 in the same direction as indicated by the + and − signs so that the FE pair 13 presents a low impedance (relative to the impedance of EL20) to the energizing voltage source $V_2$.

The bistable circuit 11 is switched to its reset state by applying a positive-going trigger pulse to the reset terminal R which polarizes FE elements 10 and 12 in respective different directions. If desired, the bistable circuit 11 could be switched from the set to the reset state by applying a negative polarity pulse to terminal S so that the FE elements 14 and 18 would be polarized in the same direction. The isolation diodes 70 and 72 (for the set case) are appropriately poled, in accordance with the polarity of the trigger pulses.

The application of the trigger pulse to terminal R reduces the conduction of the FE pair 13. The light output of EL20 decreases causing an increase in the resistance of PC30. The voltage at switch point B decreases which in turn increases the conduction of EL22 and hence its light output. The resistance of PC32 decreases with the increase of light coupled, and the voltage at switch point A increases even further. Switching of the bistable circuit continues in regenerative fashion until the EL element 22 is on and EL20 is off.

Electrical outputs may be taken, if desired, across resistors 40 and 42 respectively, for example.

Proper values of the various circuit elements are determined primarily by consideration of (1) the brightness versus control characteristics of the FE pairs, (2) the illumination versus resistance characteristics of the photoconductors, and (3) the voltage transfer to the EL elements for various isolation resistors in the FE pairs.

As an example, the values of the components of a bistable circuit according to the invention are given:

*Resistors*

41,43—220,000 ohms
40,42—1,000,000 ohms

*Voltages*

$V_1$—250 volts D.C.
$V_2$—300 volts R.M.S.

*Photoconductors*

RCA type 7412

What is claimed is:

1. A bistable circuit having input terminals and trigger terminals,
first and second series pairs of ferroelectric elements, first and second of said trigger terminals being respectively located at a midpoint between said pairs of ferroelectric elements,
first and second electroluminescent devices, each connected in a series circuit with a different one of said pairs, each of said series circuit being connected between said input terminals,
first and second variable impedance circuits, each comprising a resistor and a photoconductor device connected in series with each other and each having a common midpoint,
means applying an energizing voltage across said input terminals,
means electrically coupling said first and second impedance circuit common points to said first and second trigger terminals, respectively,
means optically coupling a said first electroluminescent device to said second impedance circuit photoconductor device and said second electroluminescent device to said first impedance circuit photoconductor device,
means for applying a biasing voltage across each of said variable impedance circuits,
and means for selectively applying a trigger signal to said trigger terminals.

2. A bistable circuit comprising,
first and second cross-coupled networks, each of said networks comprising a radiation emitting element, a pair of ferroelectric elements, and a radiation responsive variable resistance element, said ferroelectric elements and said radiation emitting elements being connected in a series circuit in the order named, said radiation responsive device being coupled at one end to the interconnection of said ferroelectric elements,
means coupled to the other end of said radiation responsive device for applying a bias voltage,
means applying an energizing voltage across each said series circuit,
means cross-coupling said radiation emitting devices of said first and second networks to said radiation responsive elements of said second and first networks respectively,
and means for coupling an electrical trigger signal to a selected one interconnection of said ferroelectric elements to switch said bistable circuit from one stable state to the other stable state.

3. In combination,
an output circuit comprising, first and second variable impedance networks each comprising a pair of ferroelectric elements connected in series with each other, each said pair presenting a higher impedance when said ferroelectric elements are polarized in different directions and a low impedance when said ferroelectric elements are polarized in the same direction, and a separate load connected in series with a different one of said variable impedance circuits, each said load comprising a light emitting device responsive to the voltage applied across it,
first and second control circuits, each comprising a light responsive variable resistance device and a fixed resistor connected in series with each other, each of said light responsive devices presenting a resistance that varies as an inverse function of the light received,
means electrically coupling each of the junction points of said variable resistance devices and the corresponding fixed resistors with a different one of the junction points of each said pair of ferroelectric elements,
means applying a bias voltage across each of said control circuits,
means optically coupling each of said light emitting devices to a different one of said light responsive devices so that each of said light emitting devices is electrically coupled to one of said light responsive devices and optically coupled to the other of said light responsive devices, means to apply a signal voltage across said first and second variable impedance circuits to energize said light emitting devices, and means for selectively applying a pulse to the junction points of said pairs of ferroelectric elements to polarize the ferroelectric elements of the desired pair in the desired directions.

4. The combination comprising:

a reference point, a plurality of radiant energy responsive variable resistance devices, a plurality of fixed resistance elements, each connected in a series circuit with a different one of said radiant energy responsive devices, means for applying a bias voltage across each said series circuit so that the voltage across each of said fixed resistance element varies as a function of the radiant energy received by its corresponding radiant energy responsive device, a plurality of pairs of ferroelectric elements, each comprising two ferroelectric elements connected in series with each other at a common point between said two ferroelectric elements, each of said pairs presenting a total impedance that varies as a function of the voltage applied between its common point and said reference point, a plurality of voltage sensitive radiant energy emitting elements each connected in series with a different one of said pairs, means electrically coupling the voltage across each of said fixed resistance elements to a different one of said common points respectively, means coupling the radiant energy output of each of said radiant energy emitting elements to a different one of said radiant energy responsive devices, whereby each of said radiant energy emitting devices is electrically coupled to one of said radiant energy responsive devices and its radiant energy output is coupled to another one of said radiant energy responsive devices, means applying an energizing voltage across each said series circuit, and means electrically coupled to each said common point for selectively applying a trigger signal to each said pair.

5. In combination, first and second variable impedance circuits, each comprising a pair of ferroelectric elements connected in series with each other, each said pair presenting a high impedance when said ferroelectric elements are polarized in different directions and a low impedance when said ferroelectric elements are polarized in the same direction, first and second electroluminescent devices, each connected in series with a different one of said variable impedance circuits, control means comprising first and second voltage divider networks, each comprising a photoconductor and a resistor connected in series with each other, means electrically coupling each of the junction points of said photoconductors and the corresponding resistors with a different one of the junction points of each of said pairs of ferroelectric elements, means for applying a bias voltage across each of said voltage divider networks, means optically coupling each of said electroluminescent devices to a different one of said photoconductors so that each of said electroluminescent devices is electrically coupled to one of said photoconductors and optically coupled to the other of said photoconductors, and means to apply an energizing voltage across said first and second variable impedance circuits.

References Cited by the Examiner

UNITED STATES PATENTS

| | | | |
|---|---|---|---|
| 2,949,538 | 8/60 | Tomlinson | 307—88.5 |
| 2,997,596 | 8/61 | Vize | 250—213 |

OTHER REFERENCES

6/60, Haining, L. E., R.C.A. Technical noted, TN No. 390.

IRVING L. SRAGOW, *Primary Examiner.*